United States Patent [19]
Navarro et al.

[11] Patent Number: 5,113,316
[45] Date of Patent: May 12, 1992

[54] SYSTEM FOR THE ASSEMBLY AND CONNECTION OF ELECTRONIC CIRCUIT BOARDS, PARTICULARLY FOR USE IN MOTOR VEHICLES

[75] Inventors: Jean L. Navarro, Paris, France; Carlo Maggioni, Cambiano, Italy

[73] Assignee: Marelli Autronica SPA, Milan, Italy

[21] Appl. No.: 609,955

[22] Filed: Nov. 7, 1990

[30] Foreign Application Priority Data
Nov. 7, 1990 [IT] Italy ................. 67974A/89

[51] Int. Cl.⁵ ............................................. H05K 7/00
[52] U.S. Cl. ............................ 361/396; 174/52.1; 361/394; 361/395; 361/412; 361/413; 361/398; 439/65; 439/57
[58] Field of Search ............. 174/52.1, 52.3, 52.4, 174/250, 253, 255, 261, 268; 357/74, 75, 80; 361/392, 393, 394, 395, 396, 399, 408, 412, 413, 414, 415, 419, 420, 421, 422; 439/44, 49, 50, 65, 66, 68, 69, 74, 75, 85, 91

[56] References Cited

U.S. PATENT DOCUMENTS

| | | | |
|---|---|---|---|
| 3,940,786 | 2/1976 | Scheingold et al. | 174/52.4 |
| 4,162,818 | 7/1979 | Martin | 439/69 |
| 4,504,887 | 3/1985 | Bakermans et al. | 174/52.4 |
| 4,571,015 | 2/1986 | Mueller | 439/66 |
| 4,652,973 | 3/1987 | Baker et al. | 361/395 |
| 4,688,864 | 8/1987 | Sorel | 361/394 |
| 4,699,593 | 10/1987 | Grabbe et al. | 439/66 |
| 4,872,843 | 10/1989 | Amstey | 439/69 |
| 4,956,694 | 9/1990 | Eide | 361/396 |
| 4,956,746 | 9/1990 | Gates, Jr. et al. | 361/396 |
| 5,034,568 | 7/1991 | Mather | 174/52.4 |

FOREIGN PATENT DOCUMENTS

| | | | |
|---|---|---|---|
| 0196726 | 10/1986 | European Pat. Off. | 439/69 |
| 2199714 | 7/1988 | United Kingdom | 361/412 |

Primary Examiner—Leo P. Picard
Assistant Examiner—Donald A. Spacks
Attorney, Agent, or Firm—Sughrue, Mion, Zinn, Macpeak & Seas

[57] ABSTRACT

A system for the assembly and connection of electronic circuits formed on a plurality of substrate or boards of identical size is described. Each board is mounted in a respective module between two elements of resilient, electrically-insulating material. The terminals of each board are connected to one or more multicore ribbon cables clamped between the resilient elements.

The modules are arranged next to each other in sequence and are clamped by tie bolts so that the resilient elements are compressed to a predetermined extent. The pack of modules thus formed is disposed in a housing, preferably of metal, carrying at least one multipole electrical connector to which at least some of the cables are connected so that the circuits carried by the boards can be connected to external devices and/or circuits.

3 Claims, 4 Drawing Sheets

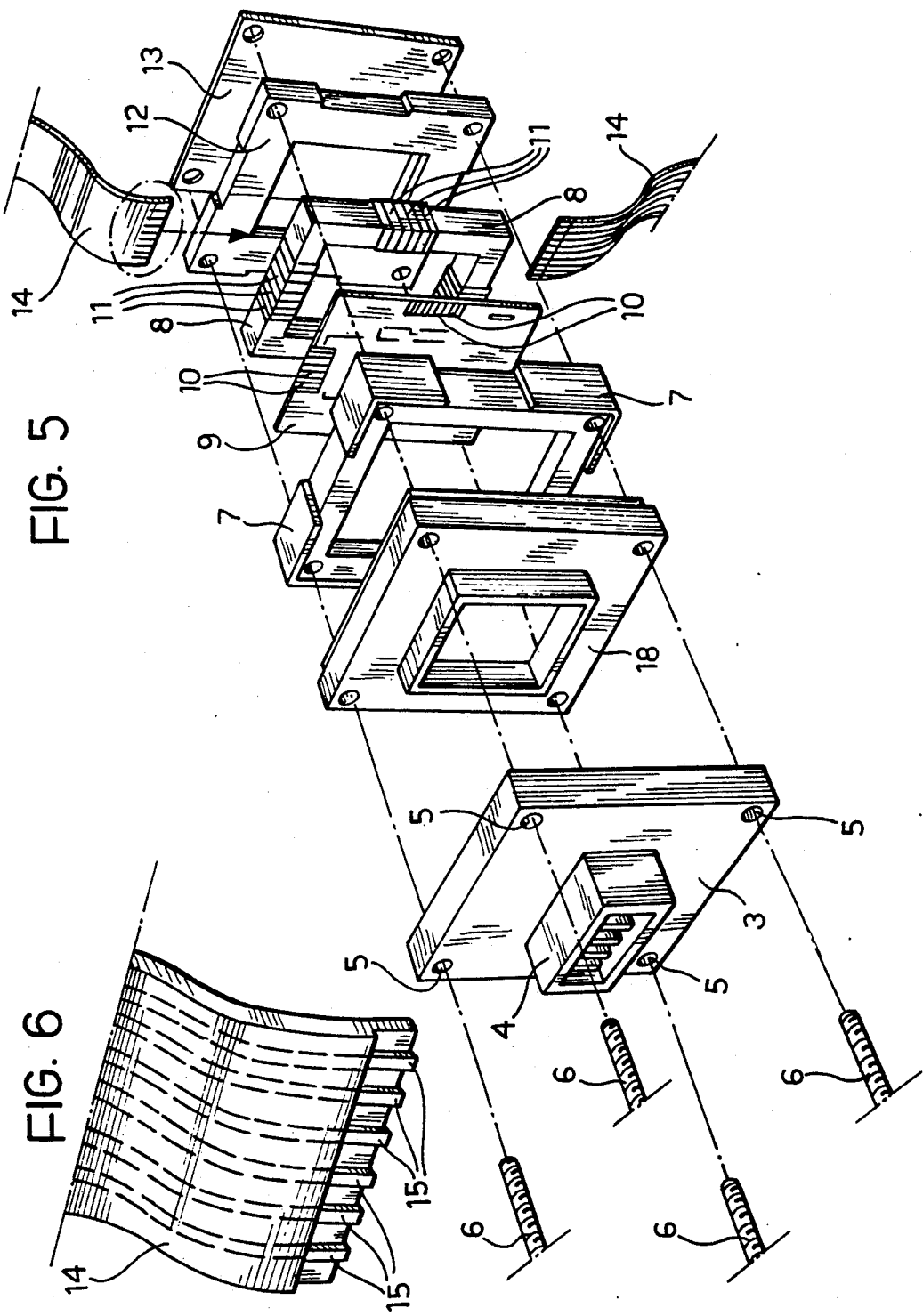

SYSTEM FOR THE ASSEMBLY AND CONNECTION OF ELECTRONIC CIRCUIT BOARDS, PARTICULARLY FOR USE IN MOTOR VEHICLES

FIELD OF THE INVENTION

The present invention relates to a system for the assembly and connection of electronic circuit boards, particularly for use in motor vehicles, such as circuit boards for controlling the ignition and/or fuel-injection.

SUMMARY OF THE INVENTION

The system according to the invention is characterised in that:
a) the electronic circuits are formed on a plurality of substrates or boards of identical size with connection terminals in the same predetermined positions on at least one edge region of one face of each substrate;
b) each board is mounted in a respective module comprising:
first and second elements of resilient, electrically-insulating material between which the board is disposed, an edge region of the second resilient element carrying electrically-conductive elements which are arranged in relative positions corresponding to those of the terminals of the boards and which extend from one face of the second resilient element to the other; and
a multicore ribbon cable comprising a plurality of insulated conductors whose relative spacing corresponds to that of the conductive elements of the second resilient element and which are bare at one end of the cable, that end of the cable being clamped between the second resilient element of the module and the first resilient element of an adjacent module with the bare end of each of its conductors in contact with a corresponding conductive element of the second resilient element; and in that
c) the modules are arranged next to each other in sequence and clamped by tie means adapted to compress their resilient elements to a predetermined extent, the pack of modules thus formed being disposed in a housing, preferably of metal, carrying at least one multipole electrical connector to which at least some of the cables are connected so that the circuits carried by the boards can be connected to external devices and/or circuits.

BRIEF DESCRIPTION OF THE DRAWINGS

Further characteristics and the advantages of the system according to the invention will become clear from the detailed description which follows, with reference to the appended drawings, provided purely by way of non-limiting example, in which:

FIG. 5 is an exploded, partial perspective view of the assembly shown in the preceding drawings, and FIG. 6 is a partial perspective view which shows an end of a multicore ribbon cable used in the assembly according to the invention.

DETAILED DESCRIPTION OF THE INVENTION

Figure 1:
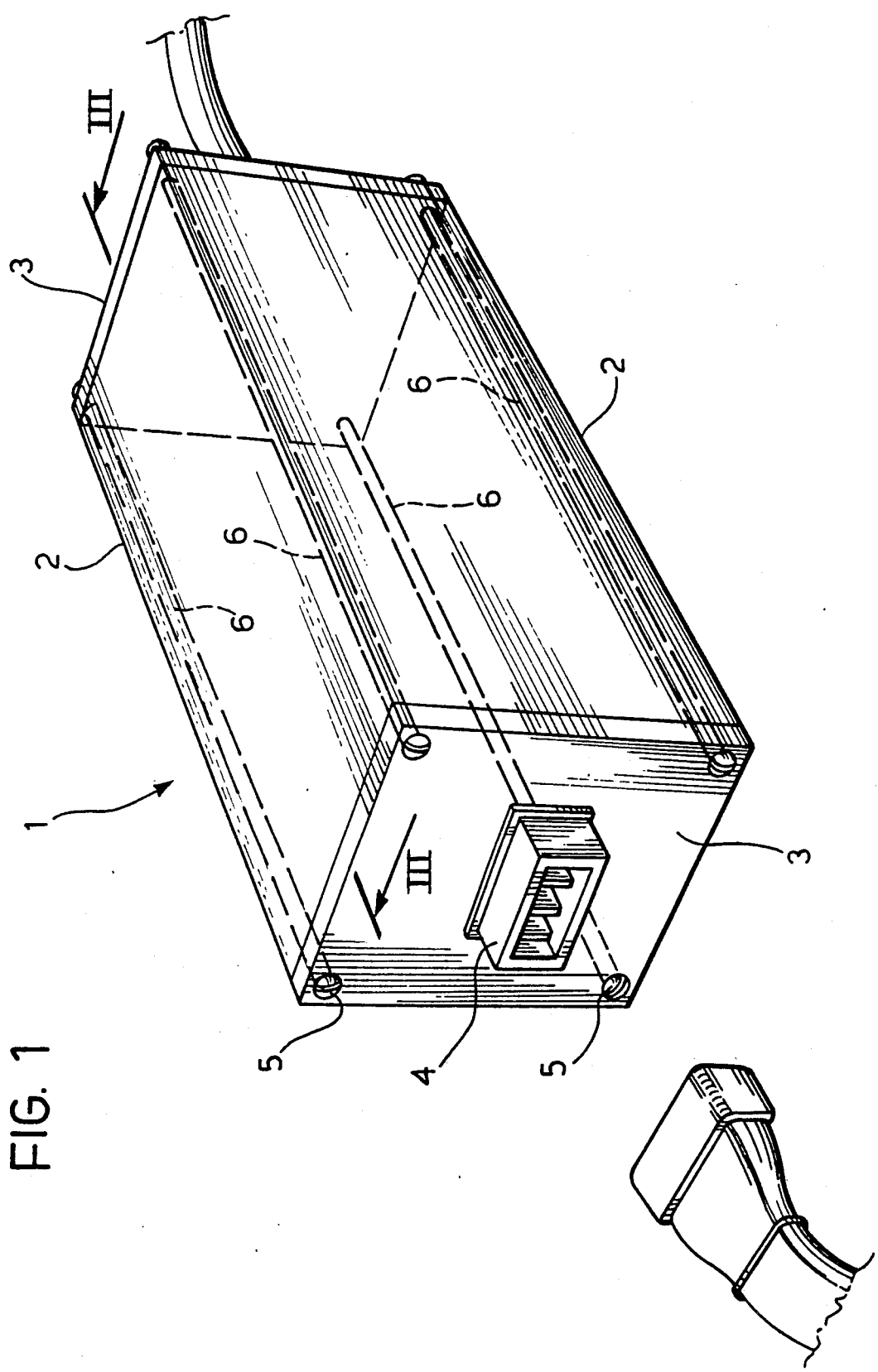
FIG. 1 is a perspective view of an assembly formed according to the invention.
Figure 3:
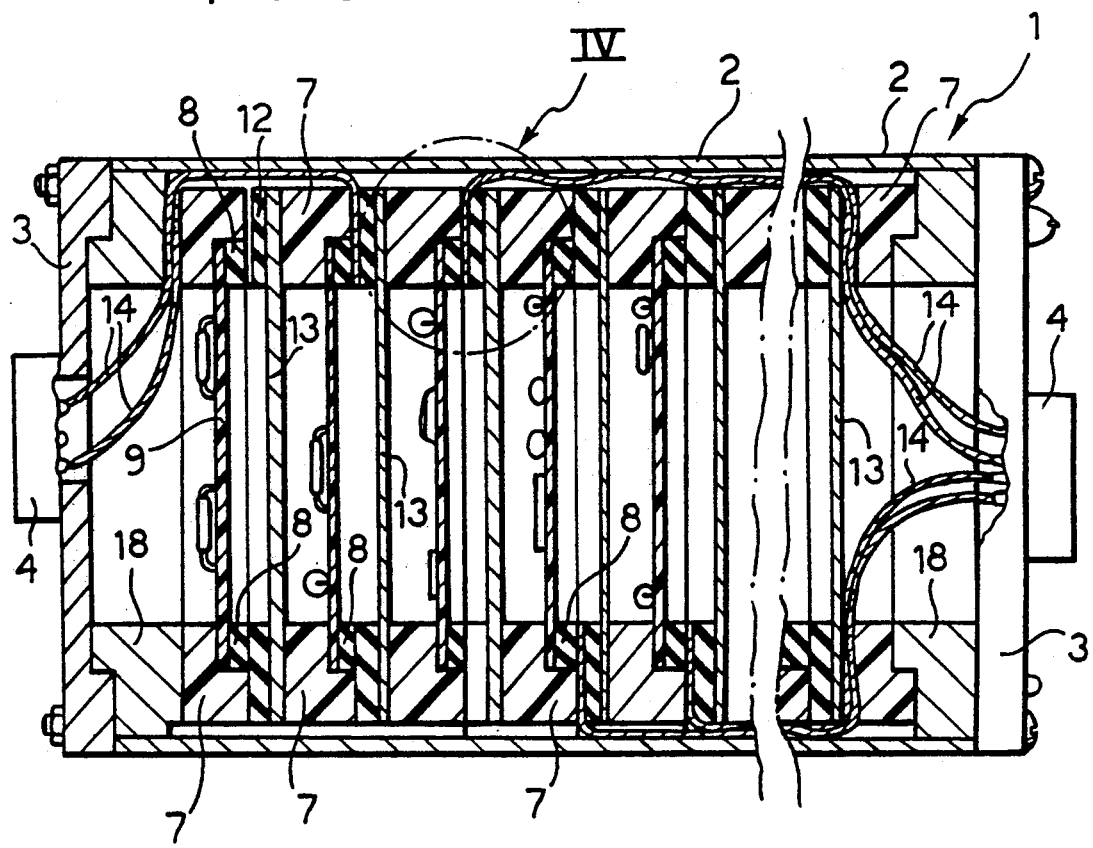
FIG. 3 is a section taken on the line III—III of FIG. 1.

With reference to the drawings, an assembly of electronic circuits formed according to the invention includes a housing, generally indicated 1 in FIGS. 1 and 3. In the embodiment illustrated, the housing comprises a quadrangular-sectioned, tubular metal element 2, for example of aluminium, closed at its ends by end plates, indicated 3, each of which carries a central multipole electrical connector, indicated 4.

Near their corners, the end plates have through-holes, indicated 5, for the passage of the ends of tie-bolts 6 which extend through the interior of the tubular element 2.

Conveniently, the ends of the tie-bolts are threaded for the engagement of corresponding nuts for clamping the end plates to the ends of the tubular element 2 of the housing.

Figure 2:
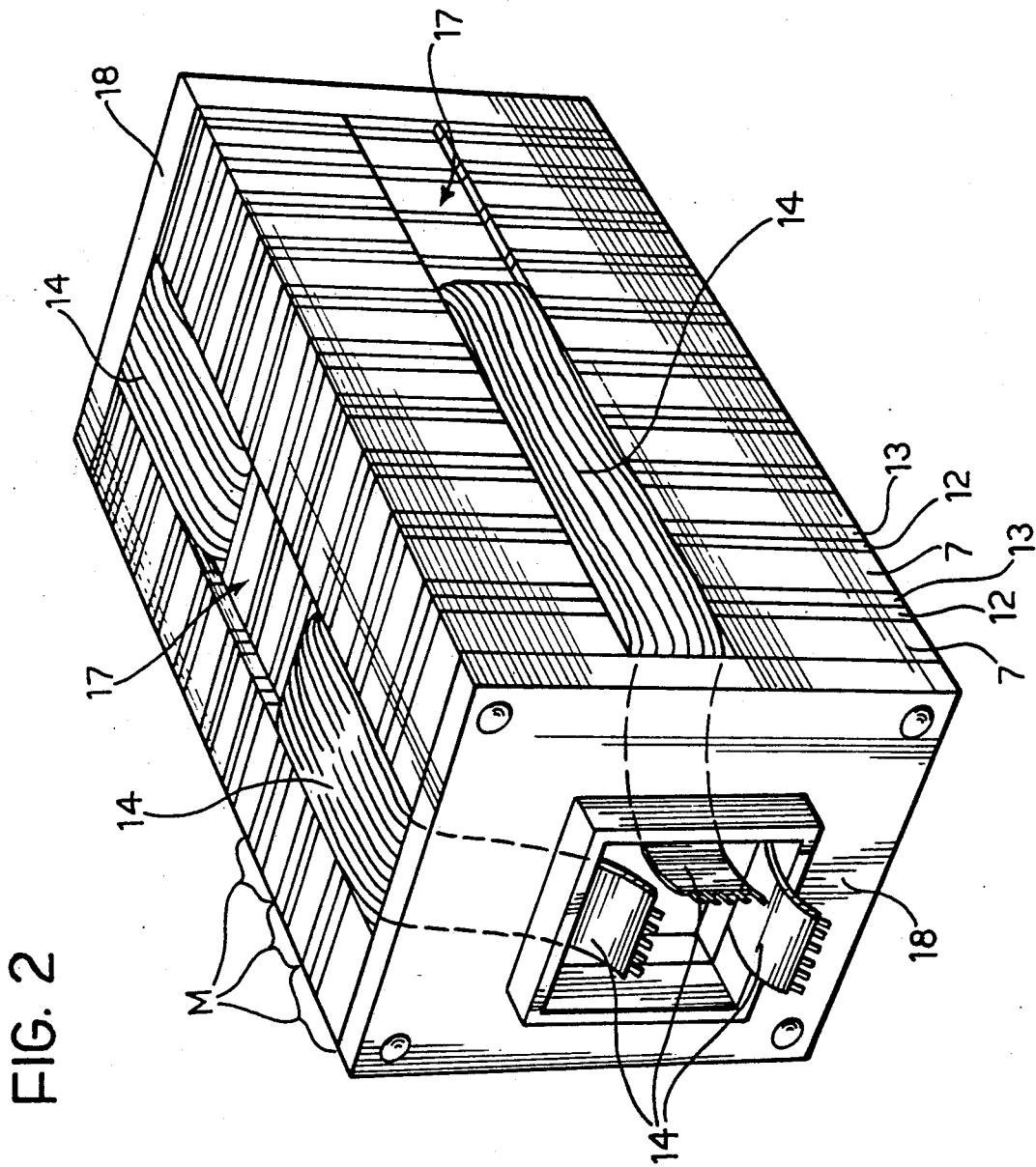
FIG. 2 is a perspective view of the assembly of FIG. 1, without part of its housing.
Figure 4:
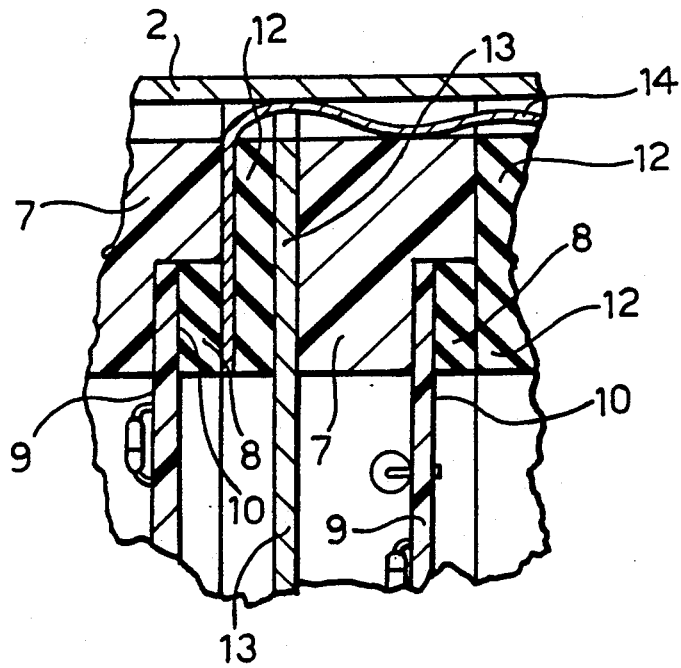
FIG. 4 is a partially-sectioned view showing a detail of FIG. 3 on an enlarged scale.

A plurality of modules, indicated M in FIG. 2, is mounted in the housing 1, each module comprising first and second frames of insulating elastomeric material, indicated 7 and 8 in FIGS. 3 to 5. In the embodiment illustrated, these frames are essentially annular and quadrangular.

Around the inner periphery of one of its faces, the frame 7 has a recess in which a circuit board, generally indicated 9, is located. The circuit boards of the various modules M are identical in size and have pluralities of connecting terminals 10 on central portions of their respective edges, in the same predetermined positions on each board. In the embodiment illustrated, each board has terminals 10 on the central portion of each of its sides but, as will be clear to an expert in the art, in general, the terminals could even be on only one side.

In each module M, the elastomeric frame 8 has external dimensions corresponding to those of the respective circuit board 9. The elastomeric element and the board 9 are fitted in the inner peripheral recess in the elastomeric element 7 of the module, as can be seen in FIGS. 3 and 4 in particular. The terminals of the board 9 face the annular elastomeric element 8. As can be seen particularly in FIG. 5, the central portions of the sides of the element 8 carry electrically-conductive elements 11 whose relative positions correspond to those of the terminals of the boards 9. The conductive elements 11 extend from one face of the elastomeric frame 8 to the other and are insulated from each other. The conductive elements may conveniently be alternate layers of conductive and insulating elastomeric material.

When each module is assembled, each conductive element 11 of the elastomeric frame 8 is in contact, in order, with a respective surface terminal 10 of the associated circuit board 9.

Each module M also includes two separating elements 12 and 13 (FIGS. 3 to 5) whose dimensions correspond to those of the elastomeric frame 7. Conveniently, the element 12 is made of elastomeric material and is positioned adjacent the elastomeric frames 7 and 8. The separator wall 13 is positioned against the elastomeric element 12, in contact with the elastomeric frame 7 of an adjacent module.

Each module also includes one or more multicore ribbon cables, indicated 14 (see, in particular, FIGS. 4 to 6). Each cable comprises a plurality of conductors 15 which are insulated from each other, spaced apart by distances corresponding to the spacing of the conductive elements 11 of the elastomeric element 8, and bare at one end (FIG. 6). This end of each cable 14 is clamped between the elastomeric elements 8 and 12 of each module with the bare end of each conductor 15 in contact with a corresponding conductive element 11 of the elastomeric frame 8. Each conductor 15 of each multicore cable 14 is thus electrically connected to a corresponding terminal of the circuit board 9 of the module.

Conveniently, although not necessarily, aligned notches are formed in the sides of the elements 7, 12 and 13 of each module so as to form lateral channels, indicated 17 in FIG. 2, in the pack of adjacent modules M mounted in the housing 1. The multicore cables 14 can extend along these channels. The cables can be used to interconnect the circuits of various boards 9 and/or to connect the circuits on the boards to devices and/or circuits outside the housing. For this purpose, the ends of the multicore cables which are not connected to the boards converge at the multipole connectors 4 carried by the end plates 3 of the casing and are connected to the terminals thereof.

As can be seen in FIG. 5, the elements 7, 12 and 13 of each module have respective holes near their corners in positions corresponding to those of the holes 5 in the end plates 3 of the housing.

The pack of modules M is arranged between two end elements, indicated 18 in FIGS. 2, 3 and 5, each of which has a central hole for the passage of the multicore cables 14 and four outer holes for the passage of the tie-bolts 6.

If, before clamping, the length of the pack of modules M with the associated end elements 18 exceeds that of the tubular element 2 of the housing by a predetermined extent, the clamping of the end plates 3 to the ends of the tubular element 2 of the housing clamps the elastomeric elements of the individual modules together with a predeterminable loading. This loading ensures good contact between the terminals of the conductor boards, the conductive elements of the elastomeric frames 8 and the conductors of the multicore cables 14. The clamping thus achieved also ensures that each component of the assembly is completely immobile, even if the assembly is subjected to considerable bouncing or vibration in use.

If, as stated above, the housing 1 is made of metal, it forms an effective electromagnetic screen for the circuits of the boards which it houses.

The modular nature of the structure of the assembly according to the invention enables it to be assembled quickly, particularly with the use of automated assembly systems.

Naturally, the principle of the invention remaining the same, the forms of embodiment and details of construction may be varied widely with respect to those described and illustrated purely by way of non-limiting example, without thereby departing from the scope of the present invention.

Thus, for example, the separator walls 13 may be omitted or may have central apertures so that a more uniform temperature can be achieved within the housing more quickly.

Moreover, with suitable clamping loads, not only could the separator walls 13 be omitted, but also the elastomeric elements 12. In this case, the end of each multicore cable 14 with the bare conductors would be clamped resiliently between the elastomeric element 8 of one module and the elastomeric element 7 of the adjacent module.

What is claimed is:

1. A system for the assembly and connection of electronic circuits, wherein the electronic circuits are formed on a plurality of substrates or boards of identical size with connection terminals in the same predetermined positions on at least one edge region of one face of each board;

each board is mounted in a respective module comprising:

first and second elements of resilient, electrically-insulating material between which the board is disposed, at least one edge region of the second resilient element carrying electrically-conductive elements which are arranged in relative positions corresponding to those of the terminals of the board and which extend from one face of the second resilient element to the other; and at least one multicore ribbon cable comprising a plurality of insulated conductors whose relative spacing corresponds to that of the conductive elements of the second resilient element and which are bare at one end of the cable, that end of the cable being clamped between the second resilient element of the module and the first resilient element of an adjacent module with the bare end of each conductor in contact with a corresponding conductive element of the second resilient element wherein the modules are arranged next to each other in sequence and are clamped by tie means adapted to compress their resilient elements to a predetermined extent, the pack of modules thus formed being disposed in a housing, preferably of metal, carrying at least one multiple electrical connector to which at least some of the cables are connected so that the circuits carried by the boards can be connected to external devices and/or circuits; and wherein the electrically-conductive elements of the second resilient element of each module are constituted by alternate layers of conductive and insulating elastomeric material.

2. A system according to claim 1, wherein the first and second elements of resilient material are made of an elastomeric material.

3. A system according to claim 1, wherein the modules have respective aligned peripheral recesses or notches defining at least one channel along which at least some of the multicore cables extend.

* * * * *